(12) United States Patent
Wakimoto

(10) Patent No.: US 10,366,893 B2
(45) Date of Patent: Jul. 30, 2019

(54) PROCESS FOR MAKING SILICON CARBIDE SEMICONDUCTOR DEVICE

(71) Applicant: Fuji Electric Co., Ltd., Kanagawa (JP)

(72) Inventor: Setsuko Wakimoto, Nagano (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 15/375,548

(22) Filed: Dec. 12, 2016

(65) Prior Publication Data
US 2017/0092500 A1   Mar. 30, 2017

Related U.S. Application Data

(63) Continuation of application No. PCT/JP2015/080108, filed on Oct. 26, 2015.

(30) Foreign Application Priority Data

Dec. 8, 2014 (JP) .................... 2014-248253

(51) Int. Cl.
*H01L 29/16* (2006.01)
*H01L 29/423* (2006.01)
(Continued)

(52) U.S. Cl.
CPC ...... *H01L 21/28035* (2013.01); *H01L 21/049* (2013.01); *H01L 21/28105* (2013.01);
(Continued)

(58) Field of Classification Search
None
See application file for complete search history.

(56) References Cited

U.S. PATENT DOCUMENTS 4,404,576 A * 9/1983 Ronen ............... H01L 21/0334
257/336
5,620,922 A * 4/1997 Yoshida ........... H01L 21/823842
257/350
(Continued)

FOREIGN PATENT DOCUMENTS

JP    56-124272 A    9/1981
JP    S62-133757 A   6/1987
(Continued)

OTHER PUBLICATIONS

Japanese Office Action dated Jul. 11, 2017, in a counterpart Japanese patent application No. 2016-563565. (A machine translation (not reviewed for accuracy) attached.).
(Continued)

*Primary Examiner* — Herve-Louis Y Assouman
(74) *Attorney, Agent, or Firm* — Chen Yoshimura LLP

(57) ABSTRACT

The present invention provides a process for producing a semiconductor device having a breakdown voltage heightened by improving the step coverage properties of the interlayer dielectric for covering polysilicon electrodes. The process includes a step in which a gate insulating film is formed on a silicon carbide substrate, a step in which a polysilicon film is formed on the gate insulating film, a step in which one or more dopants of N, P, As, Sb, B, Al, and Ar are ion implanted into the polysilicon film, and a step in which a mask is selectively formed on the polysilicon film. The exposed portions of the polysilicon film are removed by isotropic dry etching. Thus, polysilicon electrodes can be formed so that in each polysilicon electrode, the hem part sandwiched between the bottom surface and the lateral surface of the polysilicon electrode has an inclination angle of 60° or less.

8 Claims, 5 Drawing Sheets

(51) Int. Cl.
H01L 21/3213 (2006.01)
H01L 21/04 (2006.01)
H01L 21/3215 (2006.01)
H01L 21/28 (2006.01)
H01L 29/49 (2006.01)

(52) U.S. Cl.
CPC .... H01L 21/32135 (2013.01); H01L 29/1608 (2013.01); H01L 29/42372 (2013.01); H01L 29/42376 (2013.01); H01L 29/4916 (2013.01); H01L 21/32155 (2013.01)

(56) References Cited

U.S. PATENT DOCUMENTS

| | | | | |
|---|---|---|---|---|
| 5,920,781 | A * | 7/1999 | Imoto | H01L 21/266 257/E21.346 |
| 6,133,074 | A | 10/2000 | Ishida et al. | |
| 2002/0047125 | A1* | 4/2002 | Fukuda | H01L 29/045 257/77 |
| 2002/0163035 | A1* | 11/2002 | Yamazaki | G11C 17/126 257/315 |
| 2003/0124824 | A1* | 7/2003 | Mehrotra | H01L 21/823842 438/585 |
| 2005/0167397 | A1* | 8/2005 | Chen | H01L 21/31116 216/59 |
| 2005/0184348 | A1 | 8/2005 | Youn et al. | |
| 2006/0024932 | A1* | 2/2006 | Park | H01L 21/823842 438/530 |
| 2007/0057334 | A1* | 3/2007 | Chidambarrao | H01L 21/26586 257/412 |
| 2007/0158705 | A1 | 7/2007 | Takayanagi | |
| 2009/0114993 | A1 | 5/2009 | Manabe | |

FOREIGN PATENT DOCUMENTS

| | | |
|---|---|---|
| JP | 4-97523 A | 3/1992 |
| JP | 6-168916 A | 6/1994 |
| JP | 7-94718 A | 4/1995 |
| JP | 8-17934 A | 1/1996 |
| JP | 8-255828 A | 10/1996 |
| JP | 10-229197 A | 8/1998 |
| JP | 2004-235247 A | 8/2004 |
| JP | 2005-57042 A | 3/2005 |
| JP | 2005-223228 A | 8/2005 |
| JP | 2005-236290 A | 9/2005 |
| JP | 2005-353830 A | 12/2005 |
| JP | 2006-237511 A | 9/2006 |
| JP | 2007-188969 A | 7/2007 |
| JP | 5181545 B2 | 4/2013 |
| JP | 2013-232558 A | 11/2013 |
| WO | 2007/055095 A1 | 5/2007 |

OTHER PUBLICATIONS

International Search Report (ISR) issued in PCT/JP2015/080108 dated Dec. 2015.
Written Opinion (PCT/ISA/237) issued in PCT/JP2015/080108 dated Dec. 2015. (Concise Explanation of Relevance: This Written Opinion considers that the some of claims are not described by or obvious over the reference Nos. 3-11 cited in ISR above.).
English translation of Written Opinion (PCT/ISA/237) issued in PCT/JP2015/080108 dated Dec. 2015.

* cited by examiner

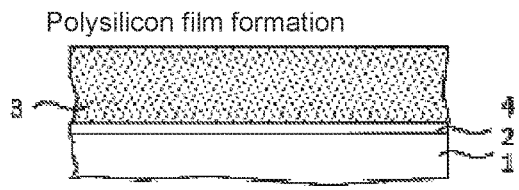
FIG. 2A Polysilicon film formation
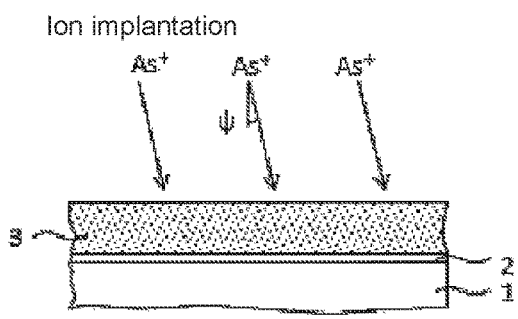
FIG. 2B Ion implantation
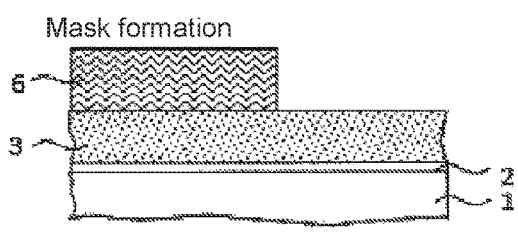
FIG. 2C Mask formation
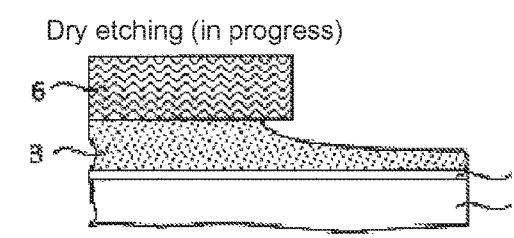
FIG. 2D Dry etching (in progress)
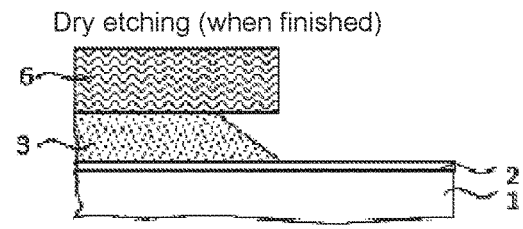
FIG. 2E Dry etching (when finished)
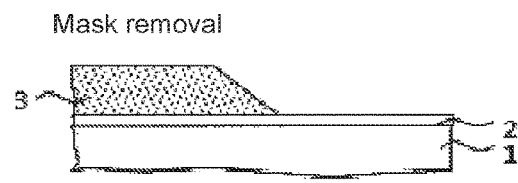
FIG. 2F Mask removal
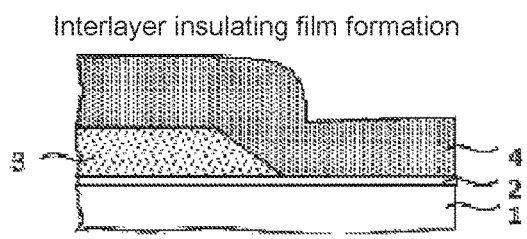
FIG. 2G Interlayer insulating film formation
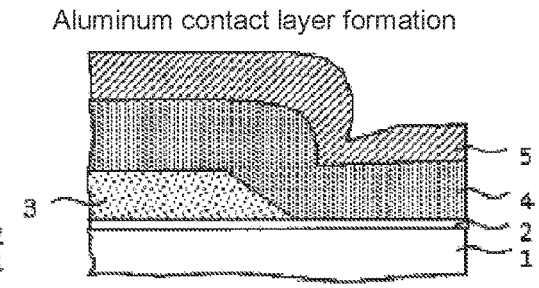
FIG. 2H Aluminum contact layer formation

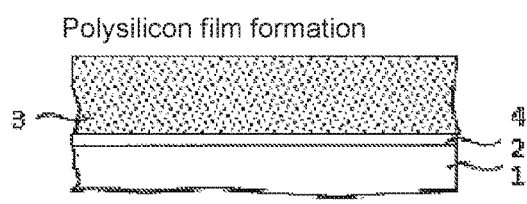
FIG. 4A Polysilicon film formation
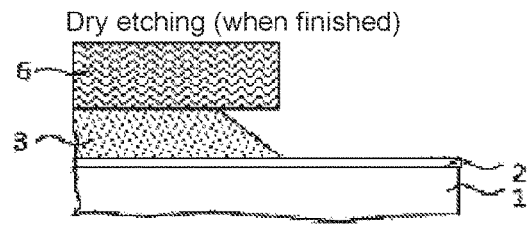
FIG. 4F Dry etching (when finished)
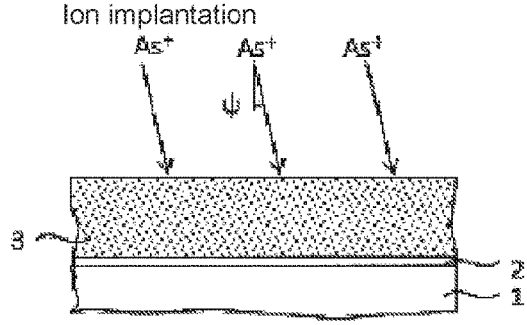
FIG. 4B Ion implantation
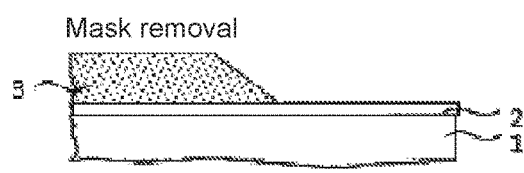
FIG. 4G Mask removal
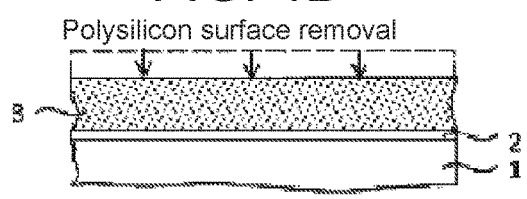
FIG. 4C Polysilicon surface removal
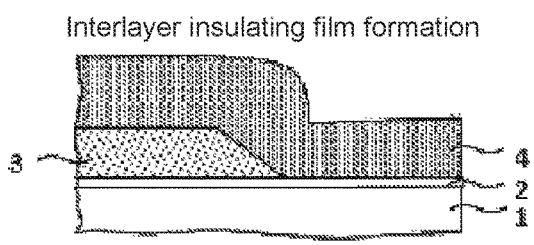
FIG. 4H Interlayer insulating film formation
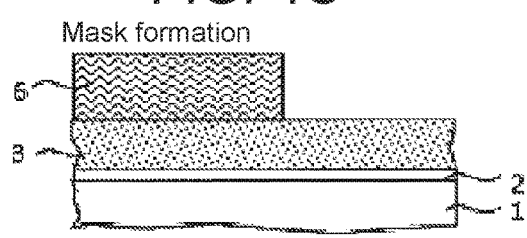
FIG. 4D Mask formation
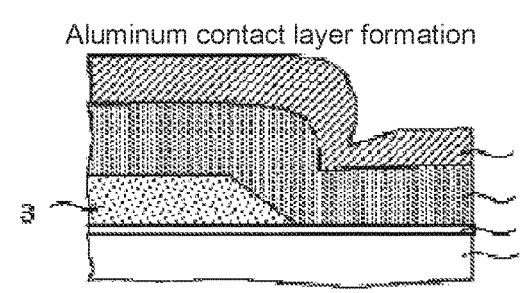
FIG. 4I Aluminum contact layer formation
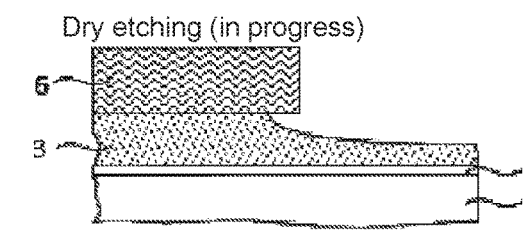
FIG. 4E Dry etching (in progress)

PROCESS FOR MAKING SILICON CARBIDE SEMICONDUCTOR DEVICE

BACKGROUND OF THE INVENTION

Technical Field

The present invention relates to a silicon carbide semiconductor device having polysilicon electrodes and a method of manufacturing the same.

Background Art

There are various types of silicon carbide semiconductor devices, such as planar MOSFET (metal oxide semiconductor field effect transistor) devices, trench MOSFET devices, IGBT (insulated gate bipolar transistor) devices, insulated gate thyristor devices, etc., and these have a structure constituted by a gate insulating film, polysilicon electrodes, interlayer insulating film, and aluminum wiring on top of the device. The demand level for dielectric strength, ampacity, and the like in these silicon carbide semiconductor devices is markedly higher than ever before, and improving the breakdown voltage of the interlayer insulating film is a significant problem.

In order to improve the breakdown voltage of the interlayer insulating film, it is necessary to further improve the step coverage characteristics of the interlayer insulating film. As shown in FIG. 5A, if plasma CVD (chemical vapor deposition) is used to form the interlayer insulating film, for example, the interlayer insulating film 4 overhangs along the periphery of the polysilicon electrode 3, forming a "V" shaped depression. As shown in FIG. 5B, if an aluminum contact layer 5 is formed on top of this, an acute-angled aluminum coating is formed in the step, which degrades dielectric strength due to electric fields concentrating there, and does not satisfy demand levels.

As a countermeasure, Patent Document 1 discloses a method whereby the coverage shape of the step is smoothed via reflow processing for 20 minutes at 930° C. after a BPSG (borophosphosilicate glass) film is formed by plasma CVD.

In addition, Patent Document 2 discloses a method whereby isotropic etching such as chemical dry etching is performed while the temperature of the silicon substrate is maintained at 50° C. to 100° C. in order to cause the side face of the polysilicon electrode to incline at an angle of 41° to 65°.

RELATED ART DOCUMENTS

Patent Documents

Patent Document 1: Japanese Patent No. 5181545
Patent Document 2: Japanese Patent Application Laid-Open Publication No. 2004-235247

SUMMARY OF THE INVENTION

However, reflow processing a BPSG film causes the silicon carbide and gate insulating film interface to deteriorate due to the high temperature thermal treatment, and is thus not preferable. Increasing the stage temperature and performing isotropic dry etching has significant results for silicon substrates, but not for silicon carbide substrates. The inventors of the present invention also considered using the dry etching method described in Patent Document 2 on a silicon carbide substrate, but the maximum inclination angle was 68°.

Accordingly, an aim of the present invention is to provide a silicon carbide semiconductor device and a method of manufacturing the same whereby the step coverage shape of the interlayer insulating film covering the polysilicon electrode is improved, thus enhancing dielectric strength. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a silicon carbide semiconductor device, including: a silicon carbide substrate; a gate insulating film on the silicon carbide substrate; and a polysilicon electrode on the gate insulating film, wherein the polysilicon electrode contains one or two or more dopants selected from N, P, As, Sb, B, Al, and Ar, and wherein a first inclination angle of a hem of the polysilicon electrode interposed between a bottom of the polysilicon electrode contacting the gate insulating film and a side face of the polysilicon electrode is 60° or lower.

The invention described above makes it possible to provide a silicon carbide semiconductor device that improves the step coverage shape of the interlayer insulating film and has higher dielectric strength.

In the silicon carbide semiconductor device of the present invention, it is preferable that a second inclination angle of a shoulder of the polysilicon electrode interposed between a top of the polysilicon electrode contacting a back side of the gate insulating film and the side face of the polysilicon electrode be an obtuse angle of 100° or greater.

The aspect described above makes it possible to provide a silicon carbide semiconductor device that improves the step coverage shape of the interlayer insulating film and has high dielectric strength.

In the silicon carbide semiconductor device of the present invention, it is preferable that an amount of the dopant in the polysilicon electrode be $1 \times 10^{14}/cm^2$ to $1 \times 10^{21}/cm^2$.

The aspect described above makes it possible to provide a silicon carbide semiconductor device having a polysilicon electrode with a first inclination angle of 60° or below.

In another aspect, the present disclosure provides a method of manufacturing a silicon carbide semiconductor device, including: forming a gate insulating film on a silicon carbide substrate; forming a polysilicon film on the gate insulating film; ion implanting one or more dopants of N, P, As, Sb, B, Al, and Ar into the polysilicon film; selectively forming a mask on the polysilicon film; forming a polysilicon electrode by removing an exposed portion of the polysilicon film via isotropic dry etching; removing the mask; and forming an interlayer insulating film on the polysilicon electrode, wherein, in the step of ion implanting the dopant into the polysilicon film, an ion implantation angle of the dopant is 60° or lower.

The invention described above makes it possible to reduce the first inclination angle of the polysilicon electrode to 60° or below, for example, and to improve the step coverage shape of the interlayer insulating film.

In another aspect, the present disclosure provides a method of manufacturing a silicon carbide semiconductor substrate, including: forming a gate insulating film on a silicon carbide substrate; forming a polysilicon film on the gate insulating film; ion implanting one or more dopants of N, P, As, Sb, B, Al, and Ar into the polysilicon film; removing a thickness of 50 nm to 300 nm from a surface layer of the polysilicon film; selectively forming a mask on the polysilicon film; forming a polysilicon electrode by removing an exposed portion of the polysilicon film via isotropic dry etching; removing the mask; and forming an interlayer insulating film on the polysilicon electrode.

The invention described above makes it possible to increase the second inclination angle of the polysilicon electrode to 100° or above, for example, and to improve the step coverage shape of the interlayer insulating film.

In the method of manufacturing the silicon carbide semiconductor substrate of the present invention, it is preferable that, in the step of ion implanting the dopant into the polysilicon film, an implantation dosage of the dopant be $1\times10^{14}/cm^2$ to $1\times10^{21}/cm^2$ in total.

The aspect described above facilitates etching of the polysilicon film in the horizontal direction and makes it easy to set the first inclination angle to 60° or below.

In the method of manufacturing the silicon carbide semiconductor substrate of the present invention, it is preferable that, in the step of ion implanting the dopant into the polysilicon film, an ion implantation angle of the dopant be 60° or lower.

The aspect described above facilitates etching of the polysilicon film in the horizontal direction and makes it easy to set the first inclination angle to 60° or below.

In the method of manufacturing the silicon carbide semiconductor substrate of the present invention, it is preferable that, in the step of isotropically dry etching the polysilicon film, the silicon carbide substrate be kept at 50° C. or higher.

The aspect described above facilitates etching of the polysilicon film in the horizontal direction and makes it easy to set the first inclination angle to 60° or below.

In the method of manufacturing the silicon carbide semiconductor substrate of the present invention, it is preferable that, in the step of forming the interlayer insulating film on the polysilicon electrode, a forming temperature of the interlayer insulating film be 900° C. or below.

The aspect described above makes it possible to form an interlayer insulating film with good step coverage characteristics at low temperature, and thus allows the manufacture of a silicon carbide semiconductor device that has excellent dielectric strength without hindering electrical characteristics.

In one aspect of the present invention, processing is performed such that the inclination angle of the hem of the polysilicon electrode is 60° or below, thus offering an improvement on the overhang step coverage shape of the interlayer insulating film above the polysilicon electrode and weakening the electric field concentration by making the "V" shaped depression shallow. This makes it possible to realize a silicon carbide semiconductor device that has an interlayer insulating film with excellent dielectric strength. It is to be understood that both the foregoing general description and the following detailed description are exemplary and explanatory, and are intended to provide further explanation of the invention as claimed.

BRIEF DESCRIPTION OF THE DRAWINGS

FIGS. 2A to 2H are a step diagram schematically showing one method of manufacturing the silicon carbide semiconductor device of the present invention.

FIGS. 4A to 4I are a step diagram schematically showing another method of manufacturing the silicon carbide semiconductor device of the present invention.

DETAILED DESCRIPTION OF EMBODIMENTS

A silicon carbide (SiC) semiconductor device of the present invention has no particular limitations as long as the device includes a polysilicon electrode, and can be a planar MOSFET, trench MOSFET, IGBT, or insulated gate thyristor, for example.

Figure 1:
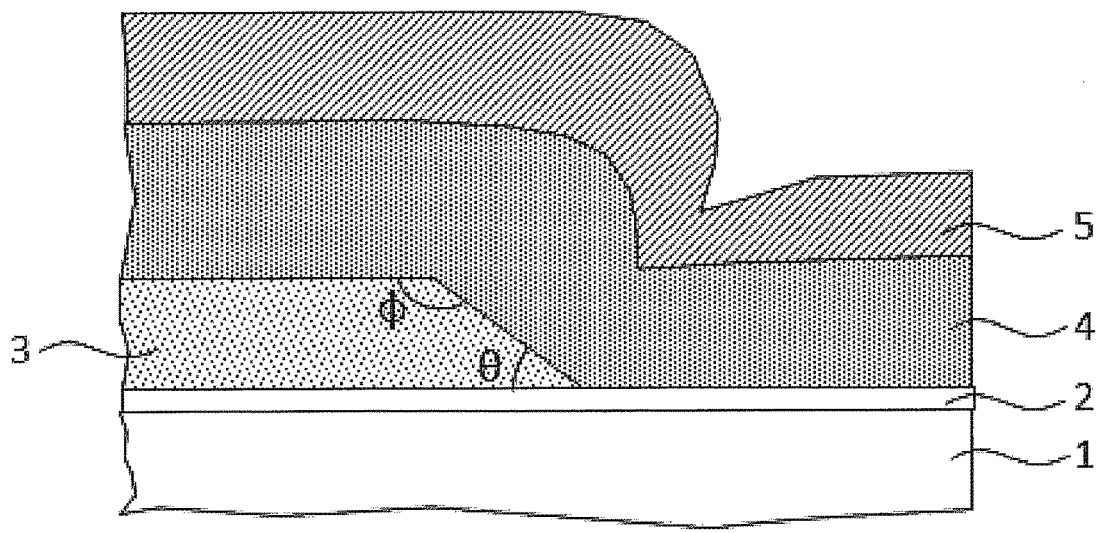
FIG. 1 is a cross-sectional view schematically showing one embodiment of the silicon carbide semiconductor device of the present invention.

FIG. 1 schematically shows a cross section of primary components of one embodiment of the SiC semiconductor substrate of the present invention (the shapes and dimensional ratios are not drawn to scale). A SiC substrate 1 has formed thereon a gate insulating film 2, a polysilicon electrode 3 on the gate insulating film 2, an interlayer insulating film 4 covering the polysilicon electrode 3, and an aluminum contact layer 5 on the interlayer insulating film 4.

The SiC semiconductor device of the present invention is characterized by a first inclination angle θ of the hem of the polysilicon electrode 3 interposed between the bottom of the polysilicon electrode 3 contacting the gate insulating film 2 and the side face of the polysilicon electrode 3 being 60° or below. Furthermore, it is preferable that a second inclination angle φ of a shoulder of the polysilicon electrode interposed between the top of the polysilicon electrode contacting the rear side of the gate insulating film and a side face of the polysilicon electrode be an obtuse angle of 100° or more. Forming the polysilicon electrode in this manner improves on the overhang step coverage shape of the interlayer insulating film, weakens electric field concentration at the step, and improves dielectric strength.

Conversely, if the first inclination angle θ is greater than 60°, then the interlayer insulating film forms the overhang shape at the step and the "V" shaped depression is formed in the surface of the interlayer insulating film at the bottom of the step, thus concentrating electric fields and degrading dielectric strength, none of which is preferable. Moreover, if the second inclination angle φ is greater than 100°, then the interlayer insulating film forms the overhang shape at the step and the "V" shaped depression is formed in the surface of the interlayer insulating film at the bottom of the step, thus concentrating electric fields and degrading dielectric strength, none of which is preferable.

In one aspect of the present invention, the polysilicon film contains $1\times10^{14}/cm^2$ to $1\times10^{21}/cm^2$ of one or two or more dopants selected from N, P, As, Sb, B, Al, and Ar. These dopants effectively increase the dry etching speed of the polysilicon, which makes it possible to control the inclination angle on the side face of the polysilicon electrode. Specifically, if the dopant concentration in the top layer of the polysilicon film is given a concentration gradient higher than the lower layer of the film, then the higher the layer of the polysilicon film, the faster the etching is in the horizontal direction (horizontal with respect to the substrate surface), which results in a tapered surface where the first inclination angle θ is small and the second inclination angle φ is large.

Furthermore, among the dopants mentioned above, P, As, Sb, and B lower the electrical resistance of the polysilicon electrode and enhance the switching performance of the SiC semiconductor device, and thus it is preferable that the concentration of these elements in the completed product be $1 \times 10^{18}/cm^3$ or higher.

Next, the respective components will be described in detail.

In the present invention, the SiC substrate 1 has no particular limitations, and a polytype 4H, 6H, or 3C SiC substrate can be used, but in a power semiconductor device it is preferable that 4H, which has high carrier mobility, be used. Furthermore, in order to reduce surface defect density, a SiC epitaxial layer can be formed on the surface of the SiC substrate.

In the present invention, the gate insulating film 2 has no particular limitations, and can be a silicon oxide film formed by thermal oxidation, a silicon oxide film formed by CVD, a silicon oxynitride film in which the surface of the silicon oxide film has received a nitriding treatment, a multilayer film in which silicon oxide films and silicon nitride films have been alternately layered by CVD, or the like.

In one aspect of the present invention, the polysilicon electrode 3 can be formed by etching a polysilicon film that has monosilane or the like as a precursor and that is formed by low-pressure CVD, or by etching a polysilicon film that has been formed by plasma CVD and that has amorphous silicon recrystallized by a thermal treatment. To lower electrical resistance of the polysilicon film, during the forming of the polysilicon film gases such as phosphine, arsine, or diborane can be mixed as necessary for the precursor in order to dope with P, As, or B, but doping may alternatively be performed by ion implantation after the polysilicon film is formed.

In the present invention, the interlayer insulating film 4 covering the polysilicon electrode 3 has no particular limitations, and a silicon oxide film, silicon nitride film, or multilayer film of silicon oxide films and silicon nitride films formed by atmospheric pressure CVD, plasma CVD, low-pressure CVD, ozone reaction CVD, high-density plasma CVD, or the like can be used, for example. In consideration of mass-producibility, cost, and film quality, it is preferable that atmospheric pressure CVD, plasma CVD, or low-pressure CVD be used as the film forming method. Furthermore, the interlayer insulating film 4 can contain other elements, such as B or P, in order to adjust film quality, and reflow processing may be performed after film formation, but it is preferable that the film forming and reflow temperature be 900° C. or below. If thermal treatment is performed at a temperature higher than 900° C., the silicon carbide and gate insulating film interface will deteriorate due to the high temperature thermal processing, and thus is not preferable. The interlayer insulating film 4 may have high moisture resistance and low stress, and may be one or a combination of BPSG, PSG (phosphosilicate glass), and NSG (non-doped silicate glass).

Next, a method of manufacturing the SiC semiconductor device of the present invention will be described using the drawings.

FIGS. 2A to 2H are cross-sectional schematic views of the SiC semiconductor device in which one aspect for the method of manufacturing the present invention is shown in sequential step order. The steps up to forming the gate insulating film 2 are omitted. The present invention includes steps for (A) forming the polysilicon film 3 on the gate insulating film 2, (B) ion implanting dopants into the polysilicon film 3, (C) forming a mask 6 by photolithography, (D) removing the exposed portion of the polysilicon film 3 by isotropic dry etching, (E) forming the polysilicon electrode 3, (F) removing the mask 6, (G) forming the interlayer insulating film 4 and then opening a connection hole (not shown), and (H) forming the aluminum contact layer 5, with the present invention being particularly characterized by the (D) isotropic dry etching of the polysilicon film 3 after the (B) ion implantation of the polysilicon film 3.

In the ion implantation step, it is preferable that the dopant injected into the polysilicon film 3 be one or two or more selected from N, P, As, Sb, B, Al, and Ar, and that the implantation dosage of the dopant be $1 \times 10^{14}/cm^2$ to $1 \times 10^{21}/cm^2$ in total, and more preferably $5 \times 10^{14}/cm^2$ to $5 \times 10^{15}/cm^2$, and even more preferably $1 \times 10^{15}/cm^2$ to $3 \times 10^{15}/cm^2$. If the implantation is below $1 \times 10^{14}/cm^2$, then the first inclination angle θ becomes greater and the interlayer insulating film 4 forms the overhang shape, which is not preferable. If the implantation dosage is increased, then the first inclination angle θ of the polysilicon electrode can be made smaller, but the ion implantation time will be longer, and this is thus a tradeoff with throughput.

Figure 3A:
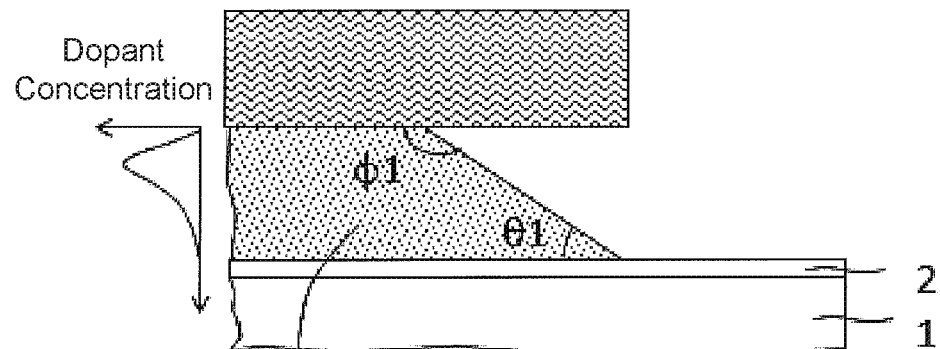
FIGS. 3A to 3C are cross-sectional views schematically showing the relationship between dopant concentration distribution and dry etching shape.
Figure 3B:
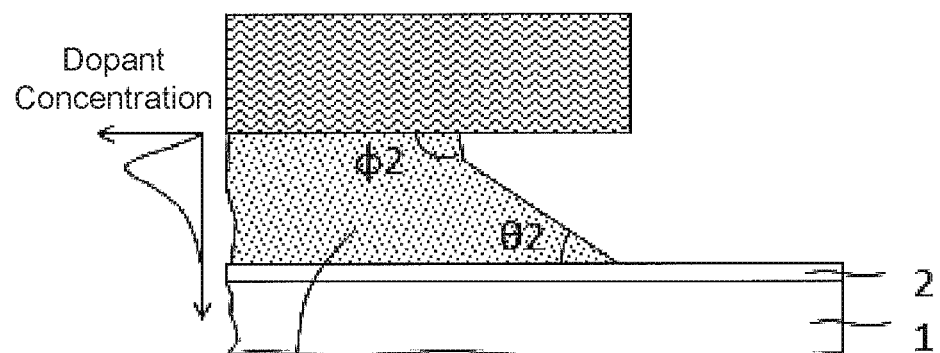
Figure 3C:
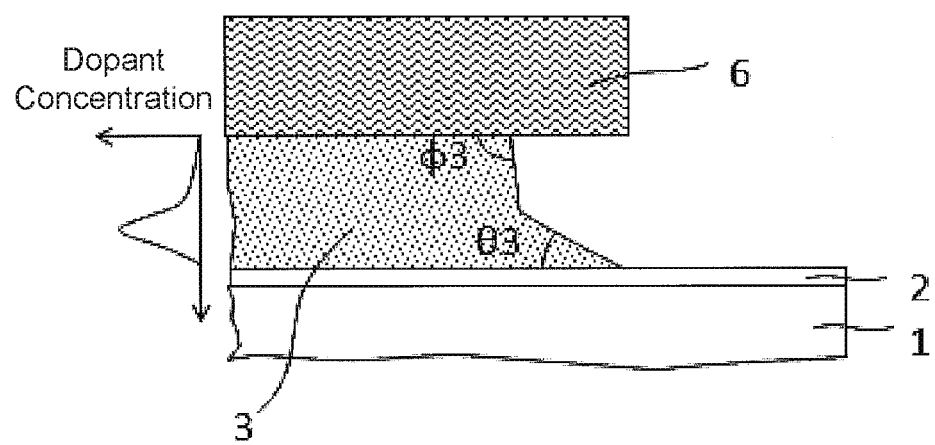
Figure 5A:
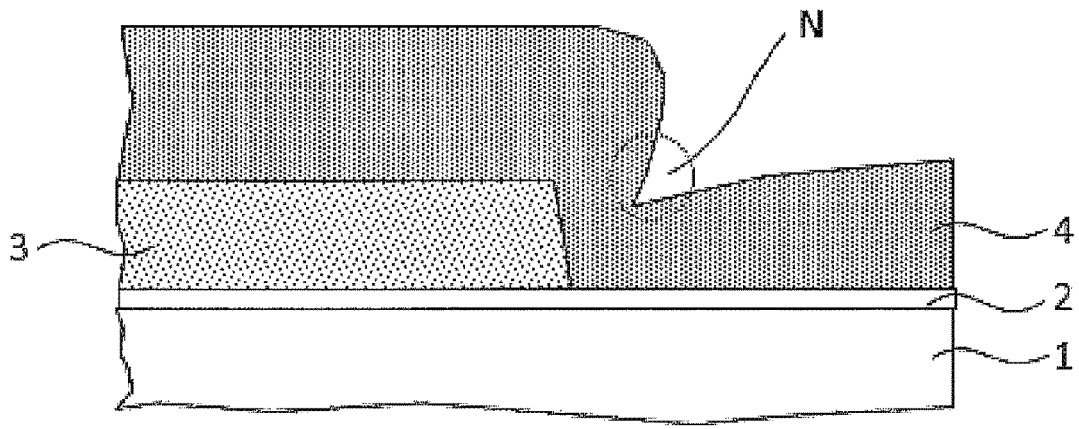
FIGS. 5A and 5B are cross-sectional views schematically showing one embodiment of a conventional silicon carbide semiconductor device.
Figure 5B:
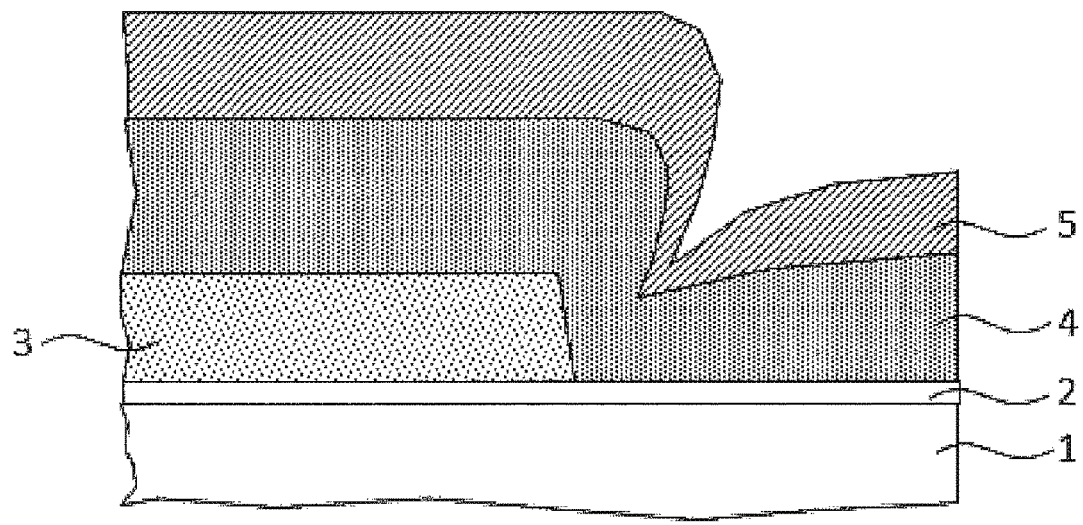

It is preferable that the accelerating voltage of the dopant ions be 10 keV to 50 keV, and more preferably 30 keV to 50 keV. As shown in FIG. 3A, if the accelerating voltage is configured in this manner, the dopant concentration near the surface of the polysilicon film is low, but has a concentration distribution whereby the peak is near the surface of the polysilicon film (the top layer), with the concentration dropping towards the surface of the insulating film after the peak is exceeded. If dry etching at high temperature, the surface vicinity being low concentration does not pose a significant problem, and the polysilicon electrode 3 having the preferred shape will be formed. However, as the etching temperature becomes lower, etching in the horizontal direction will stop progressing at portions of the polysilicon film near the surface with low dopant concentration, resulting in the side walls of the film rising at a sharp angle as shown in FIG. 3B, which is not preferable. Meanwhile, FIG. 3C shows a non-preferable shape of the polysilicon electrode 3 resulting from the polysilicon film being etched when, due to excessive accelerating voltage, the peak dopant concentration is in the bottom layer of the polysilicon film and the dopant concentration in the top layer is low. The top layer of the polysilicon film has a low dopant concentration, and thus etching in the horizontal direction stops progressing, the side walls rise at a sharp angle, and the second inclination angle ϕ becomes less than 100°. The polysilicon electrodes shown in FIGS. 3B and 3C are susceptible to having the interlayer insulating film form the overhang shape.

The dopant concentration distribution in the polysilicon film is also related to ion implantation angle ψ. The ion implantation angle ψ is defined with the direction of ions entering the SiC substrate perpendicularly being 0°. As the ion implantation angle ψ become smaller, implantation becomes deeper, and conversely as the ion implantation ψ becomes larger, implantation becomes shallower. If the accelerating voltage of the ions is 10 keV to 50 keV, it is preferable that the ion implantation angle ψ be 60° or below.

Further, in the present invention, it is preferable that the polysilicon film 3 be formed by isotropic dry etching. The isotropic dry etching has no particular limitations, and can be done by a dry etching device with little contribution of ions, such as a dry etching device having a plasma source in a location separated from the object to be processed, for example. The reactant gas for etching the polysilicon can be a mix of $CF_4$ and $O_2$, for example. The temperature of the stage for mounting the object to be processed is preferably 50° C., and even more preferably 70° C. If the temperature is lower than 50° C., the etching speed in the horizontal direction of the polysilicon film 3 will drop, and thus the first inclination angle θ will be larger and the second inclination angle ϕ will be smaller, which is not preferable.

FIGS. 4A to 4I are cross-sectional schematic views of the SiC semiconductor device in which another aspect for the method of manufacturing the present invention is shown in sequential step order. The steps up to forming the gate insulating film 2 are omitted. The present invention includes steps for (A) forming the polysilicon film 3 on the gate insulating film 2, (B) ion implanting dopants (described later) into the polysilicon film 3, (C) removing 50 nm to 300 nm of thickness of the surface layer of the polysilicon film 3 (D) forming a mask 6 by photolithography, (E) removing the exposed portion of the polysilicon film 3 by isotropic dry etching, (F) forming the polysilicon electrode 3, (G) removing the mask 6, (H) forming the interlayer insulating film 4 and then opening a connection hole (not shown), and (I) forming the aluminum contact layer 5, with the present invention being particularly characterized by the (C) removal of the surface layer of the polysilicon film 3 and the (E) isotropic dry etching of the polysilicon film 3 after the (B) ion implantation of the polysilicon film 3.

As shown in FIG. 3B, if the dopant concentration in the surface layer of the polysilicon film 3 is low and the shoulder of the polysilicon electrode sticks out after dry etching, 50 nm to 300 nm of the thickness of the surface layer of the polysilicon film 3 can be removed to counter this. In this manner, the portion with high dopant concentration can be placed at the top layer of the polysilicon film, which makes it possible to isotropically dry etch the polysilicon film 3 into the shape shown in FIG. 3A.

The method of removing the surface layer of the polysilicon film has no particular limitations as long as the processing is performed at 900° C. or below, and it is possible to use methods such as full surface etch-back via dry etching, CMP (chemical mechanical planarization), or oxidizing the polysilicon surface and etching with an aqueous hydrogen fluoride solution. If thermal treatment is performed at a temperature higher than 900° C., the interface of the SiC substrate 1 and gate insulating film 2 will deteriorate due to the high temperature thermal processing, and thus is not preferable.

WORKING EXAMPLES

Working Example 1

The gate insulating film was formed on the SiC substrate and the polysilicon film was deposited via low-pressure CVD at a 500 nm thickness, and then ion implantation was performed with As$^+$ ions at an accelerating voltage of 30 keV, implantation angle of 0°, and implantation dosage of $1 \times 10^{15}/cm^2$. Next, a resist mask was formed by photolithography, and then a chemical dry etching device was used to isotropically dry etch the polysilicon film with reactant gas $CF_4$-50% $O_2$ at a stage temperature of 70° C. Thereafter, the resist was removed, and a silicon oxide film was deposited at a thickness of 1000 nm via atmospheric CVD.

Working Example 2

The ion implantation angle during implantation of the As ions was set to 45°, and the other parameters were the same as Working Example 1.

Working Example 3

The ion implantation angle during implantation of the As ions was set to 60°, and the other parameters were the same as Working Example 1.

Working Example 4

The implantation dosage of the As ions was set to $5 \times 10^{14}/cm^2$, and the other parameters were the same as Working Example 1.

Working Example 5

The implantation dosage of the As ions was set to $3 \times 10^{15}/cm^2$, and the other parameters were the same as Working Example 1.

Working Example 6

The implantation dosage of the As ions was set to $3 \times 10^{15}/cm^2$, the stage temperature during isotropic dry etching was set to 50° C., and the other parameters were the same as Working Example 1.

Working Example 7

The implantation dosage of the As ions was set to $3 \times 10^{15}/cm^2$, 50 nm was etched off the entire surface of the polysilicon film by dry etching after ion implantation, the stage temperature during isotropic dry etching was set to 50° C., and the other parameters were the same as Working Example 1.

Comparison Example 1

A gate insulating film was formed on a SiC substrate, a 500 nm polysilicon film was deposited via low-pressure CVD, a resist mask was formed by photolithography, and a chemical dry etching device was used with reactant gas $CF_4$-50% $O_2$ at a substrate temperature of 100° C. to isotropically dry etch the polysilicon film. Thereafter, the resist was removed, and a silicon oxide film was deposited at a thickness of 1000 nm via atmospheric CVD.

Comparison Example 2

A gate insulating film was formed on a Si substrate, a 500 nm polysilicon film was deposited via low-pressure CVD, a resist mask was formed by photolithography, and a chemical dry etching device was used with reactant gas $CF_4$-50% $O_2$ at a stage temperature of 100° C. to isotropically dry etch the polysilicon film. Thereafter, the resist was removed, and a silicon oxide film was deposited at a thickness of 1000 nm via atmospheric CVD.

<Evaluation Method>

The first inclination angle θ and the second inclination angle ϕ were measured from a scanning electron microscope image of a cleavage cross-section of a sample.

<Results>

Table 1 shows the measurement values of the process parameters, first inclination angle θ, and second inclination angle ϕ.

TABLE 1

| | Substrate | Ion Implantation | | Whole surface etching amount (nm) | Stage temperature during dry etching (° C.) | First inclination angle θ | Second inclination angle φ |
| --- | --- | --- | --- | --- | --- | --- | --- |
| | | Ion implantation angle (degree) | Implantation dosage (/cm²) | | | | |
| Working Example 1 | SiC | 0 | $1 \times 10^{15}$ | — | 70° C. | 39 | 141 |
| Working Example 2 | SiC | 45 | $1 \times 10^{15}$ | — | 70° C. | 46 | 134 |
| Working Example 3 | SiC | 60 | $1 \times 10^{15}$ | — | 70° C. | 54 | 126 |
| Working Example 4 | SiC | 0 | $5 \times 10^{14}$ | — | 70° C. | 50 | 130 |
| Working Example 5 | SiC | 0 | $3 \times 10^{15}$ | — | 70° C. | 41 | 139 |
| Working Example 6 | SiC | 0 | $3 \times 10^{15}$ | — | 50° C. | 60 | 90 |
| Working Example 7 | SiC | 0 | $3 \times 10^{15}$ | 50 | 50° C. | 60 | 100 |
| Comparison Example 1 | SiC | — | — | — | 100° C. | 68 | 112 |
| Comparison Example 2 | Si | — | — | — | 100° C. | 40 | 140 |

Comparison Example 1 uses a SiC substrate, and Comparison Example 2 uses a Si substrate. The film forming parameters of the polysilicon film are the same, and neither has undergone ion implantation. The stage temperature for both was set at 100° C. for the isotropic dry etching of the polysilicon film. The first inclination angle for the Si substrate was small at 40°, but large for the SiC substrate at 68°, with a first inclination angle of 60° or below being impossible for a SiC substrate in conventional methods.

In Working Examples 1 to 6, after the As⁺ ions are implanted into the polysilicon film, the polysilicon film is isotropically dry etched to form the polysilicon electrode.

Working Examples 1 to 3 show that increasing the ion implantation angle increases the first inclination angle, but it is still possible to form a polysilicon electrode with an inclination angle of 60° or below even at an ion implantation angle of 60°.

Working Examples 4 and 5 show that, even if the ion implantation dosage is reduced to $5 \times 10^{14}$/cm² (Working Example 4), or increased to $3 \times 10^{15}$/cm² (Working Example 5), the inclination angle can be processed at 60° or below.

Working Example 6 shows that the first inclination angle can be processed at 60° or below even if the stage temperature of the dry etching device is lowered to 50° C. However, the second inclination angle is 90°, resulting in a protruding shoulder shape, which is not preferable.

As a countermeasure, Working Example 7 etches 50 nm from the whole surface of the polysilicon film before patterning. Isotropic dry etching is performed at a stage temperature of 50° C., but the corner of the shoulder shape is removed, and the second inclination angle was able to be set to 100°.

After the polysilicon film was formed and ion implantation was performed, the film was isotropically dry etched to make the first inclination angle of the side face of the polysilicon electrode a smooth shape of 60° or below, thus improving the step coverage shape of the silicon oxide film formed on the polysilicon electrode.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A method of manufacturing a silicon carbide semiconductor device, comprising:
   forming a gate insulating film on a silicon carbide substrate;
   forming a polysilicon film on an entire surface of the gate insulating film;
   ion implanting one or more dopants selected from a group consisting of N, P, As, Sb, B, Al, and Ar into the polysilicon film that is on the entire surface of the gate insulating film;
   before conducting any thermal process on the polysilicon film that has been ion implanted, removing a thickness of 50 nm to 300 nm uniformly from a surface layer of the polysilicon film that has been ion implanted;
   selectively forming a mask on the polysilicon film from which the thickness of 50 nm to 300 nm has been removed uniformly;
   forming a polysilicon electrode by removing an exposed portion of the polysilicon film that is exposed by the mask via isotropic dry etching;
   removing the mask; and
   forming an interlayer insulating film on the polysilicon electrode.

2. The method of manufacturing the silicon carbide semiconductor device according to claim 1, wherein the step of ion implanting the dopant, the step of removing the thickness of 50 nm to 300 nm, and the step of removing the exposed portion of the polysilicon film via isotropic dry etching are performed such that a doping distribution of the dopant in the polysilicon film after the thickness of 50 nm to 300 nm is removed from the surface layer peaks adjacent to a top surface of the polysilicon film and becomes progressively lower with depth, and the resulting polysilicon electrode has inversely tapered side faces that do not have a steep vertical wall meeting at the top surface at an angle less than 100 degrees.

3. The method of manufacturing the silicon carbide semiconductor device according to claim 2, wherein, in the step of ion implanting the dopant into the polysilicon film, an implantation dosage of the dopant is $1\times10^{14}/cm^2$ to $1\times10^{21}/cm^2$.

4. The method of manufacturing the silicon carbide semiconductor device according to claim 3, wherein the implantation dosage of the dopant is $5\times10^{14}/cm^2$ to $5\times10^{15}/cm^2$.

5. The method of manufacturing the silicon carbide semiconductor device according to claim 4, wherein the implantation dosage of the dopant is $1\times10^{15}/cm^2$ to $3\times10^{15}/cm^2$.

6. The method of manufacturing the silicon carbide semiconductor device according to claim 2, wherein, in the step of isotropically dry etching the polysilicon film, the silicon carbide substrate is kept at 50° C. or higher.

7. The method of manufacturing the silicon carbide semiconductor substrate according to claim 2, wherein, in the step of forming the interlayer insulating film on the polysilicon electrode, a forming temperature of the interlayer insulating film is 900° C. or below.

8. The method of manufacturing the silicon carbide semiconductor device according to claim 2, wherein the step of ion implanting the dopant, the step of removing the thickness of 50 nm to 300 nm, and the step of removing the exposed portion of the polysilicon film via isotropic dry etching are performed such that an angle of a hem of the resulting polysilicon electrode interposed between a bottom of the polysilicon electrode contacting the gate insulating film and a side face of the polysilicon electrode is 60° or lower.

* * * * *